United States Patent
Oh et al.

(10) Patent No.: US 9,705,452 B2
(45) Date of Patent: Jul. 11, 2017

(54) PROTECTION CIRCUIT FOR POWER AMPLIFIER

(71) Applicant: Avago Technologies General IP (Singapore) Pte. Ltd., Singapore (SG)

(72) Inventors: Jun Hee Oh, Gyeonggi-do (KR); Moon Suk Jeon, Seoul (KR); Joo Min Jung, Gyeonggi-do (KR); Jung Hyun Kim, Gyeonggi-do (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/927,880

(22) Filed: Oct. 30, 2015

(65) Prior Publication Data

US 2017/0126184 A1    May 4, 2017

(51) Int. Cl.
| | |
|---|---|
| H03F 1/52 | (2006.01) |
| H03F 3/21 | (2006.01) |
| H03F 3/19 | (2006.01) |
| H03F 3/45 | (2006.01) |

(52) U.S. Cl.
CPC .............. H03F 1/52 (2013.01); H03F 3/19 (2013.01); H03F 3/21 (2013.01); H03F 3/45071 (2013.01); *H03F 2200/222* (2013.01); *H03F 2200/387* (2013.01); *H03F 2200/426* (2013.01); *H03F 2200/451* (2013.01); *H03F 2203/45116* (2013.01)

(58) Field of Classification Search
CPC ........................................................ H03F 1/52
USPC ............................................. 330/298, 207 P
See application file for complete search history.

(56) References Cited

U.S. PATENT DOCUMENTS

| | | | | |
|---|---|---|---|---|
| 3,428,909 | A * | 2/1969 | Rubin ...................... | H03F 3/26 330/139 |
| 4,829,270 | A * | 5/1989 | Anderson ................ | H03F 1/56 330/280 |
| 5,847,610 | A * | 12/1998 | Fujita ...................... | H03F 1/52 330/207 P |
| 7,486,137 | B2 * | 2/2009 | Magoon ................... | H03F 1/02 330/102 |
| 7,595,696 | B2 | 9/2009 | Sugiura et al. | |
| 7,710,204 | B2 | 5/2010 | Karoui et al. | |
| 7,733,176 | B2 * | 6/2010 | Magoon ................... | H03F 1/02 330/140 |
| 7,813,092 | B2 | 10/2010 | Ma et al. | |
| 7,952,433 | B2 * | 5/2011 | An ........................... | H03F 1/0266 330/295 |
| 8,258,876 | B1 | 9/2012 | Osika et al. | |
| 8,344,806 | B1 | 1/2013 | Franck et al. | |
| 2005/0259375 | A1 | 11/2005 | Akimura et al. | |

(Continued)

OTHER PUBLICATIONS

Karoui, et al., "A protection circuit for HBT RF power amplifier under load mismatch conditions", IEEE 2008.

*Primary Examiner* — Henry Choe

(57) ABSTRACT

A power amplifier comprising a power stage comprises a voltage detection circuit configured to detect an output voltage of the power stage, a current detection circuit configured to detect an output current of the power stage, a control voltage generation circuit configured to generate a control voltage substantially proportional to the detected output voltage and the detected output current, and a control circuit configured to decrease an output power of the power stage when the control voltage exceeds a predetermined value.

17 Claims, 11 Drawing Sheets

(56) References Cited

U.S. PATENT DOCUMENTS

2013/0016447 A1    1/2013   Kitabata et al.
2013/0293283 A1   11/2013   Jeon et al.

\* cited by examiner

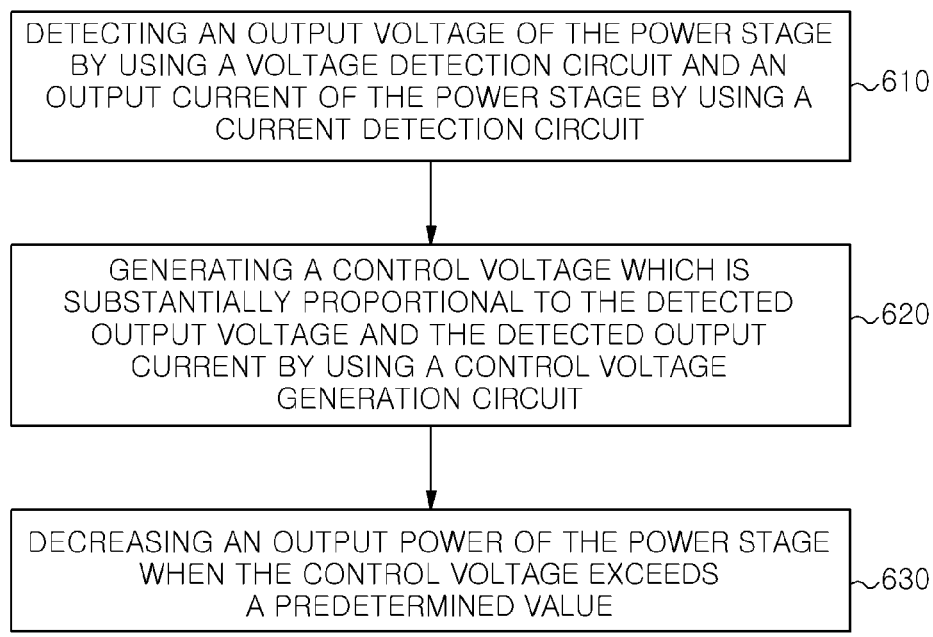

PROTECTION CIRCUIT FOR POWER AMPLIFIER

BACKGROUND

A power amplifier in a mobile system may be placed in an extreme situation, such as a mismatched load, high input power, electrostatic discharge (ESD), etc., requiring a protection circuit capable of protecting same even under such extreme situations.

For instance, a power stage of a power amplifier may experience a high voltage swing as well as a high current swing in a failure zone. This means that the protection circuit should be operable in case of both voltage stress and current stress. However, existing protection circuits operate for either voltage stress or current stress only. Further, a protection circuit that employs a complicated structure including, e.g., operational amplifier may be difficult to implement, and may cause problems such as a delay due to the complicated structure.

Accordingly, there is a need to develop a protection circuit which has a simpler structure and is capable of protecting a power amplifier more effectively against both voltage stress and current stress.

BRIEF DESCRIPTION OF THE DRAWINGS

The exemplary embodiments provided herein may be best understood when read in conjunction with the accompanying drawings. It should be noted that various features depicted therein are not necessarily drawn to scale, for the sake of clarity and discussion. Wherever applicable and practical, like reference numerals refer to like elements.

FIG. 13 is a flow chart of a method for protecting a power amplifier by using a protection circuit in accordance with an exemplary embodiment.

DETAILED DESCRIPTION

In the following detailed description, for purposes of explanation but not limitation, representative embodiments disclosing specific details are set forth in order to facilitate a better understanding of the present teachings. However, it will be apparent to one having ordinary skill in the art having had the benefit of the present disclosure that other embodiments in accordance with the present teachings that depart from the specific details disclosed herein may still remain within the scope of the appended claims. Moreover, descriptions of well-known apparatuses and methods may be omitted so as not to obscure the description of the representative embodiments.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a," "an" and "the" include both singular and plural referents, unless the context clearly dictates otherwise. Thus, for example, "a device" may include a single or plural devices.

Although the terms "first," "second," etc. may be used herein to describe various elements, these elements should not be limited by these terms. These terms are used to distinguish one element from another. For example, a first element could be termed a second element, and, similarly, a second element could be termed a first element, without departing from the scope of the present teachings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
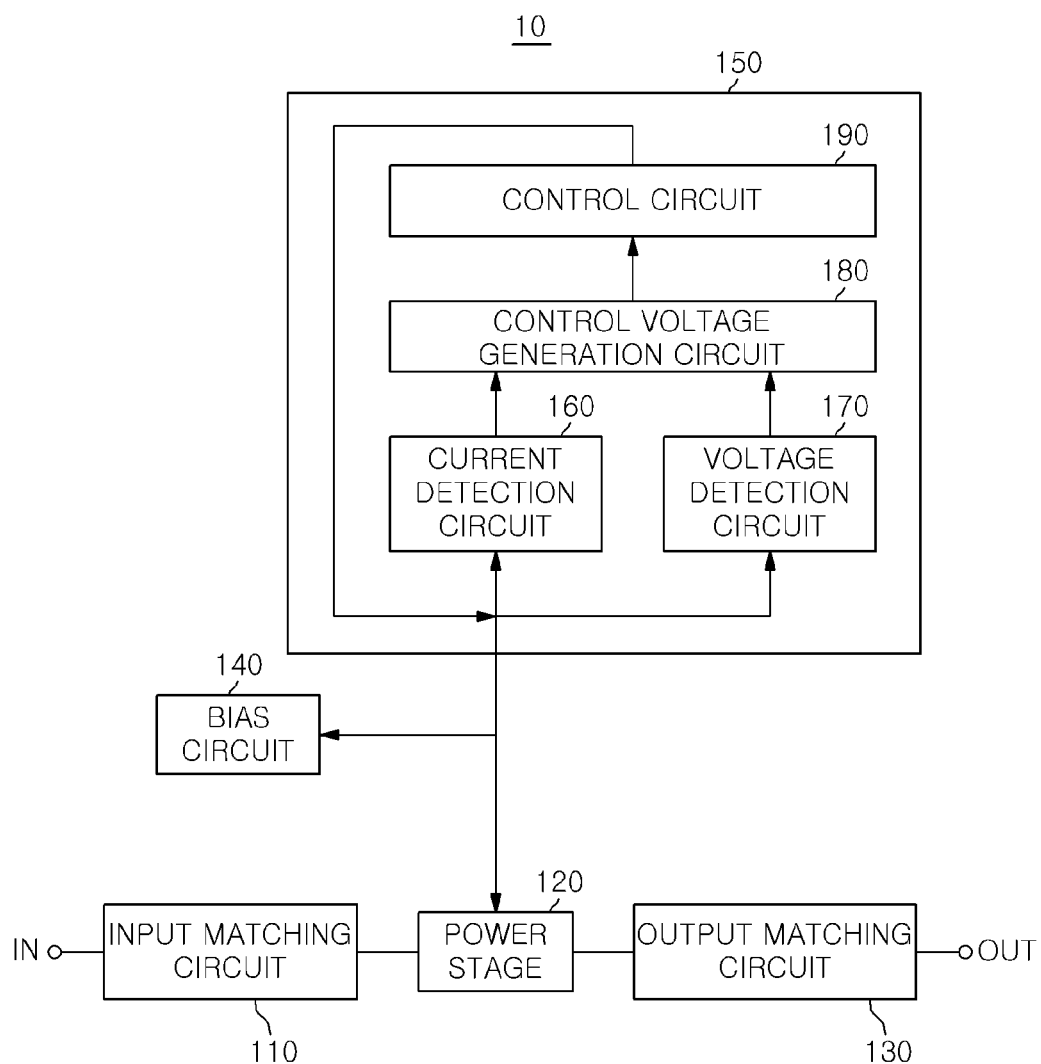
FIG. 1 is a block diagram of a power amplifier with a protection circuit in accordance with an exemplary embodiment.

FIG. 1 is a block diagram of a power amplifier with a protection circuit in accordance with an exemplary embodiment. The power amplifier 10 of FIG. 1 may include an input matching circuit 110, a power stage 120, an output matching circuit 130, a bias circuit 140, and a protection circuit 150. The power stage 120 may amplify an input signal based on a bias voltage and a bias current and output an amplified signal. The bias circuit 150 may bias the power stage 120 by applying the bias voltage and the bias current to a bias node of the power stage 120. The power stage 120 may be implemented, for example, with a heterojunction bipolar transistor (HBT) as illustrated in FIG. 1. The power amplifier 10 of FIG. 1 may be implemented as one integrated circuit.

An RF signal inputted via an input terminal IN passes through the input matching circuit 110, which is coupled to an input node of the power stage 120 and performs impedance matching, is inputted to the power stage 120, and is then amplified by the power stage 120. The amplified RF signal is outputted from the power stage 120, passes through the output matching circuit 130, which is coupled to an output node of the power stage 120 and performs impedance matching, and is then outputted via an output terminal OUT. During this process, the power amplifier 10 may be damaged when an over-voltage is applied to or an over-current flows through an output terminal of the power stage 120. Thus, the power amplifier 10 in accordance with the present embodiment may include the protection circuit 150 to protect the power amplifier 10. The protection circuit 150 may include a current detection circuit 160, a voltage detection circuit 170, a control voltage generation circuit 180, and a control circuit 190.

The current detection circuit 160 and the voltage detection circuit 170 may detect an output voltage and an output current of the power stage 120, respectively. The control voltage generation circuit 180 may generate a control voltage $V_{con}$ that is substantially proportional to the detected output voltage and the detected output current. When the value of the control voltage $V_{con}$ generated from the voltage generating circuit 180 exceeds a predetermined value, the control circuit 190 may decrease an output power of the power stage 120. In detail, in accordance with embodiments, the control circuit 190 may act as either a bias switching circuit to decrease the output power by decreasing the bias current to the power stage 120, or a gain attenuation circuit to decrease the output power by decreasing the input power of the power stage 120. As described above, not only the power stage 120 but also the power amplifier 10 may be protected by the protection circuit 150 that adjusts the output power of the power stage 120 to be in a predetermined range.

Figure 2:
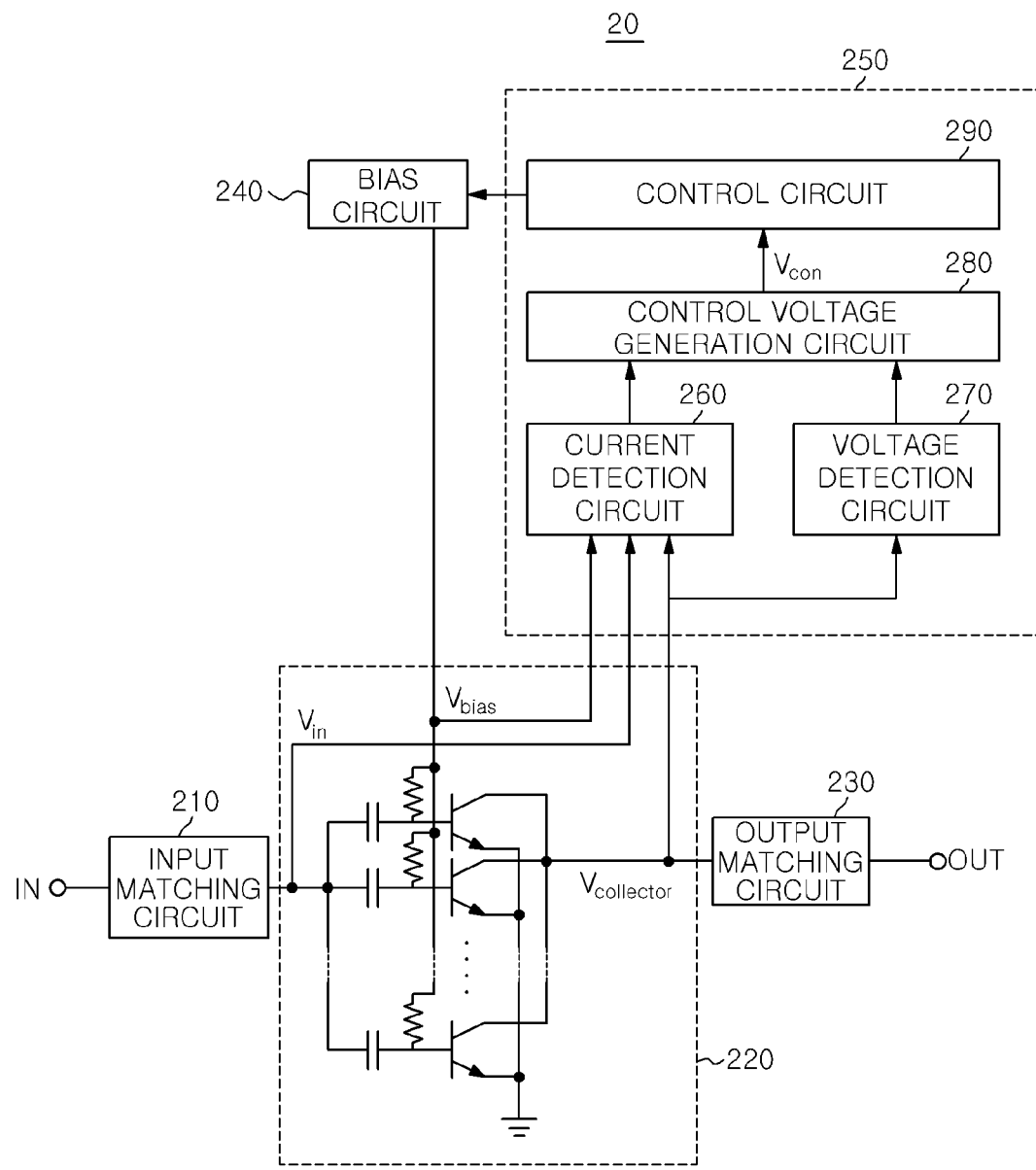
FIG. 2 is a schematic diagram of a power amplifier with a bias switching type protection circuit in accordance with an exemplary embodiment.

FIG. 2 is a schematic diagram of a power amplifier with a bias switching type protection circuit in accordance with an exemplary embodiment. The power amplifier 20 of FIG. 2 may include an input matching circuit 210, a power stage 220, an output matching circuit 230, a bias circuit 240, and the protection circuit 250. The power stage 220 in accordance with the present embodiment may be implemented according to a single-ended amplification method, and the input matching circuit 210 and the output matching circuit 230 may also be implemented based on the single-ended amplification method. The protection circuit 250 may include a current detection circuit 260, a voltage detection circuit 270, a control voltage generation circuit 280, and a control circuit 290.

Figure 3:
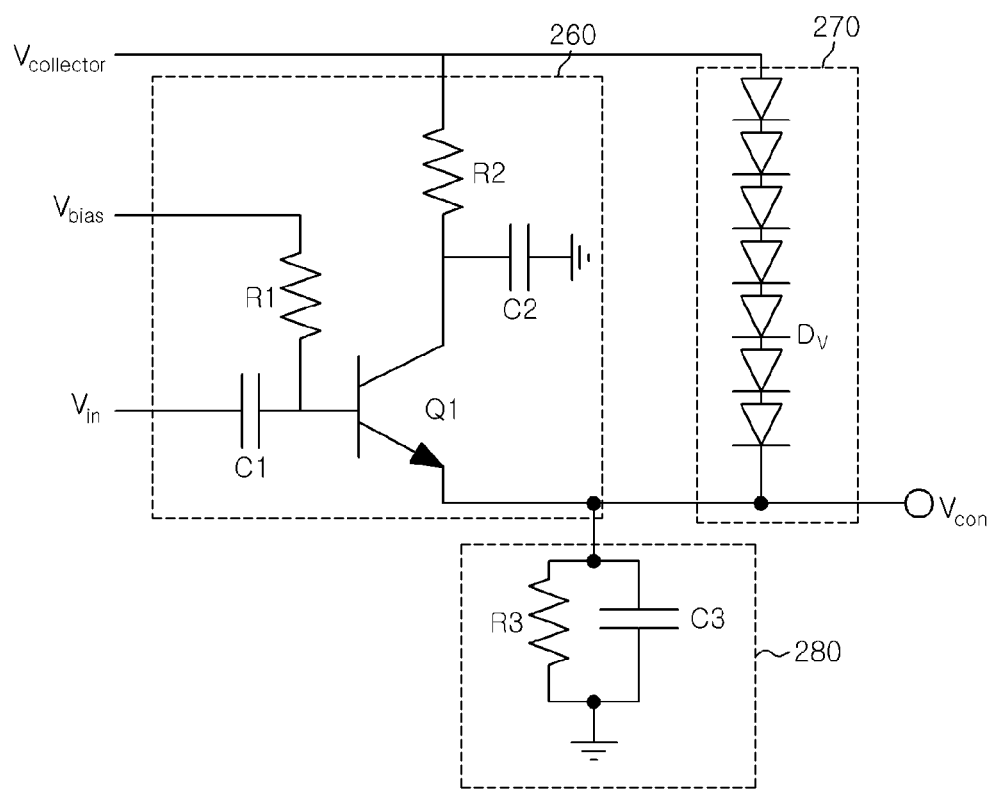
FIG. 3 is a circuit diagram of a current detection circuit, a voltage detection circuit and a control voltage generation circuit included in the protection circuit of FIG. 2.

FIG. 3 is a circuit diagram of the current detection circuit, the voltage detection circuit and the control voltage generation circuit included in the protection circuit of FIG. 2. The current detection circuit 260 and the voltage detection circuit 270 are coupled in parallel between an output node of the power stage 220 and an output node of the control voltage generation circuit 280. One end of the control voltage generation circuit 280 is coupled, via the output node thereof, to the current detection circuit 260 and the voltage detection circuit 270, and another end thereof is grounded.

The current detection circuit 260 may include a first transistor Q1, a first resistor R1, a second resistor R2, a first capacitor C1, and a second capacitor C2. A base of the first transistor Q1 is coupled to an input node of the power stage 220 via the first capacitor C1, and is coupled to a bias node of the power stage 220 via the first resistor R1. A collector of the first transistor Q1 is coupled to the output node of the power stage 220 via the second resistor R2, and is grounded via the second capacitor C2. An emitter of the first transistor Q1 is coupled to the output node of the control voltage generation circuit 280. Although the first transistor Q1 and the other transistors included in components which will be described below are described herein as NPN type bipolar transistors, different types of transistors may be used and a circuit structure may be appropriately modified according to the different types of transistors.

The voltage detection circuit 270 may include a diode set $D_V$ which has one or more diodes connected in series. In the present disclosure, it is assumed that, when a plurality of diodes are connected in series, an anode and a cathode of each of the plurality of diodes are respectively connected to a cathode of a diode adjacent to the diode in one direction and an anode of a diode adjacent to the diode in another direction. An anode of the diode set $D_V$ is coupled to the output node of the power stage 220 and a cathode of the diode set $D_V$ is coupled to the output node of the control voltage generation circuit 280.

One end of the control voltage generation circuit 280 is coupled, via the output node thereof, to the current detection circuit 260 and the voltage detection circuit 270, and another end thereof is grounded. The control voltage generation circuit 280 may include a parallel RC (resistor-capacitor) circuit in which a third resistor R3 and a third capacitor C3 are coupled in parallel to each other. One end of the parallel RC circuit is coupled to the output node of the control voltage generation circuit 280, and another end thereof is grounded.

Figure 4:
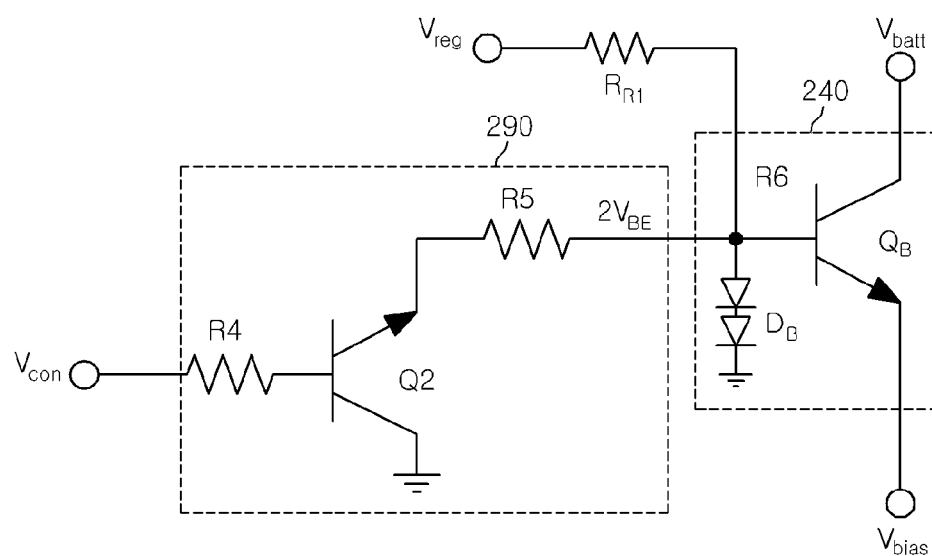
FIG. 4 is a circuit diagram of a bias circuit and a control circuit included in the protection circuit of FIG. 2.

FIG. 4 is a circuit diagram of the bias circuit and the control circuit included in the protection circuit of FIG. 2.

The bias circuit 240 may include a bias diode set $D_B$ which has one or more diodes connected in series, and a bias transistor $Q_B$. Desirably, the base diode set $D_B$ may have a structure in which two EBC diodes (base-emitter junction diodes) which are generally used are connected in series. A collector of the bias transistor $Q_B$ is coupled to a battery voltage $V_{batt}$ of the power amplifier 20. A base of the bias transistor $Q_B$ is coupled to a regulated voltage $V_{reg}$ which outputs a voltage corresponding to a preset value via a first regulator resistor $R_{R1}$. The preset value may be appropriately selected by those of ordinary skill in the art based on a bias current supplied from the bias circuit 240 to the power stage 220. The regulated voltage $V_{reg}$ that outputs the voltage corresponding to the preset value may be implemented using a device such as a regulator. An emitter of the bias transistor $Q_B$ is coupled to the bias node of the power stage 220. An anode of the base diode set $D_B$ is coupled to the base of the bias transistor $Q_B$ and a cathode thereof is grounded.

The control circuit 290 may include a second transistor Q2, a fourth resistor R4, and a fifth resistor R5. A base of the second transistor Q2 is coupled to the output node of the control voltage generation circuit 280 via the fourth resistor R4, and a collector thereof is grounded. An emitter of the third transistor Q2 is coupled to the base of the bias transistor $Q_B$ via the fifth resistor R5.

Operations of the protection circuit 250 in accordance with the present embodiment will be described with reference to FIGS. 2 to 4 below. Parts of the protection circuit 250 that are as described above with reference to FIG. 1 may not be described.

The current detection circuit 260 and the voltage detection circuit 270 may detect an output voltage and an output current of the power stage 220, respectively. The control voltage generation circuit 280 may generate, via the output node thereof, a control voltage $V_{con}$ that is substantially proportional to the detected output voltage and the detected output current.

In detail, the current detection circuit 260 may be coupled in parallel to the power stage 220, and may operate based on the same input current and the same bias current with the power stage 220. That is, the current detection circuit 260 may function as an additional amplifier separately from the power stage 220. Thus, when a high output current flows through the power stage 220, the current detection circuit 260 may also output a high current which is substantially proportional to the output current of the power stage 220. The current outputted from the current detection circuit 260 flows into the control voltage generation circuit 280, thereby generating the control voltage $V_{con}$ substantially proportional to the output current of the power stage 220. Thus, as the output current of the power stage 220 increases, the control voltage $V_{con}$ also increases.

The diode set $D_V$ of the voltage detection circuit 270 may be 'on' only when the output voltage of the power stage 220 is greater than a threshold voltage of the diode set $D_V$. Here, the threshold voltage is equal to the product of a turn-on voltage of the respective diodes included in the diode set $D_V$ and the total number of the diodes. When the diode set $D_V$ is 'on,' a current flows into the control voltage generation circuit 280 via the diode set $D_V$ to generate a control voltage $V_{con}$ which is substantially proportional to the output voltage of the power stage 220. Thus, the control voltage $V_{con}$ increases as the output voltage of the power stage 220 increases.

Through the above process, the control voltage $V_{con}$ is generated based on both the output voltage and the output current of the power stage 220. Here, the control voltage generation circuit 280 may include the RC circuit and may thus function as a low-pass filter. Since the power amplifier 20 including the protection circuit 250 functions as a closed loop, a problem such as an oscillation issue may occur. The RC circuit included in the control voltage generation circuit 280 may decrease a loop gain of the system to lessen the problem.

Various methods may be used to set a range of the output voltage or the output current of the power stage 220 wherein the protection circuit 250 operates. First, the number of the diode set $D_V$ may be adjusted to set an operating range of the voltage detection circuit 270. Also, values of the first resistor R1 and the first capacitor C1 may be adjusted to set the operating range of the current detection circuit 260. A transconductance of the first transistor Q1 increases when the value of the first resistor R1 decreases, and higher input driving power is supplied to the first transistor Q1 when the value of the first capacitor C1 is increased. An increase in the transconductance and the input driving power leads to an increase in the output current of the current detection circuit 260, thereby increasing the control voltage $V_{con}$. The increasing of the control voltage $V_{con}$ means that a lowest limit of the output current of the power stage 220 wherein the protection circuit 250 operates decreases. In addition, the control voltage $V_{con}$ may be increased by increasing the value of the third resistor R3 included in the control voltage generation circuit 280.

The various setting methods above may be individually performed, and the above characteristics of the protection circuit 250 in accordance with the present embodiment may not only effectively protect the power amplifier 20 but also increase the convenience of use of the protection circuit 250.

The control voltage $V_{con}$ is applied to the control circuit 290 via the output node of the control voltage generation circuit 280. When the applied control voltage $V_{con}$ exceeds a predetermined value, the second transistor Q2 included in control circuit 290 draws a current from the bias circuit 240. The predetermined value may be determined according to the characteristics of the second transistor Q2. The above operation of the control circuit 290 decreases the bias current to be supplied to the power stage 220 and consequentially decreases a gain of the power stage 220, thereby stabilizing the output power of the power stage 220.

Through the above process, the protection circuit 250 in accordance with the present embodiment may handle an abnormal state of the power amplifier 20 by detecting both an output voltage and an output current, thereby more stably protecting the power amplifier 20.

Figure 5:
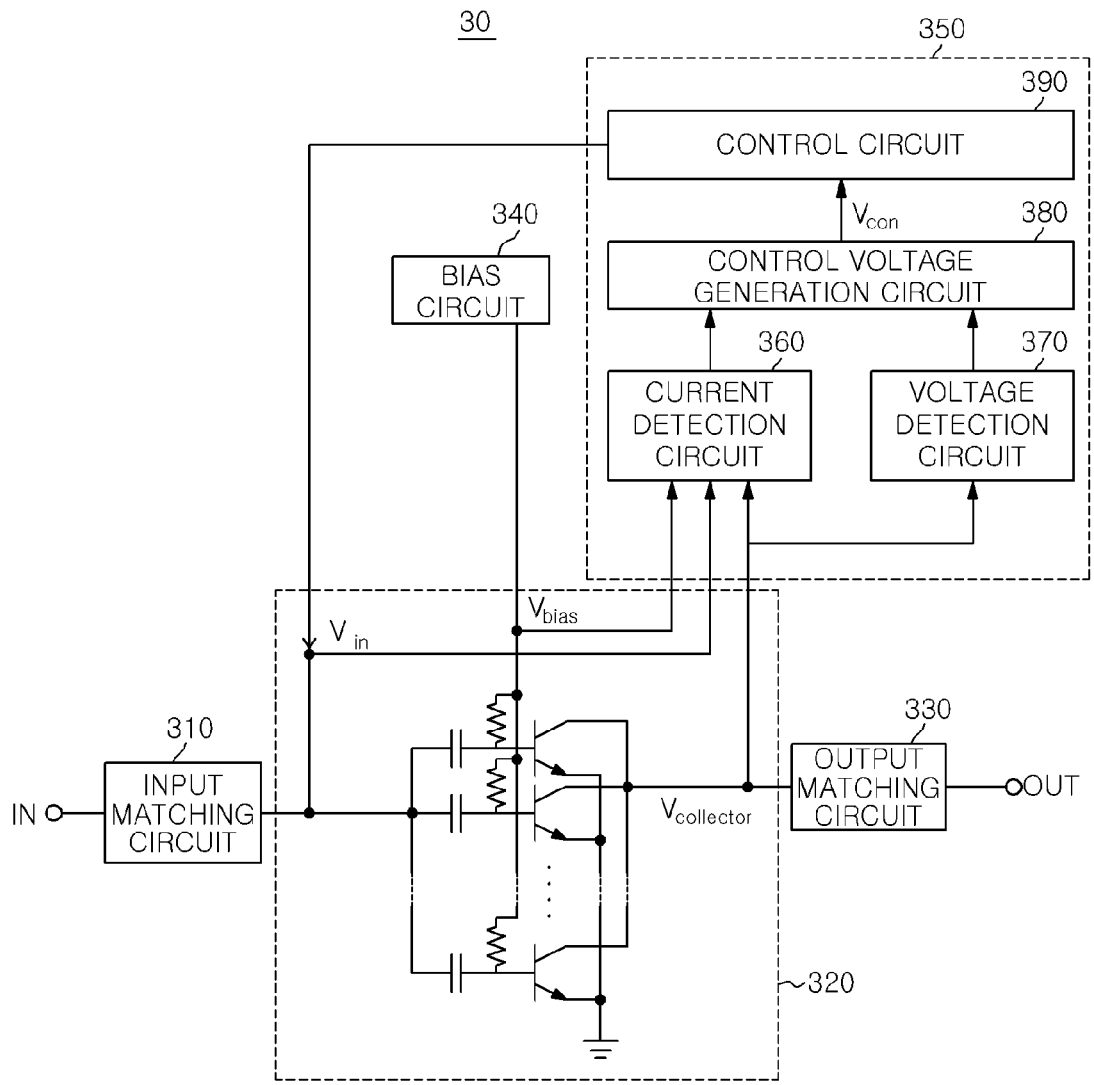
FIG. 5 is a schematic diagram of a power amplifier with a gain attenuation type protection circuit in accordance with an exemplary embodiment.

FIG. 5 is a schematic diagram of a power amplifier with a gain attenuation type protection circuit in accordance with an exemplary embodiment. The power amplifier 30 of FIG. 5 may include an input matching circuit 310, a power stage 320, an output matching circuit 330, a bias circuit 340, and the protection circuit 350. The protection circuit 350 may include a current detection circuit 360, a voltage detection circuit 370, a control voltage generation circuit 380, and a control circuit 390. The present embodiment is substantially the same as the embodiment of FIG. 2, except that the control circuit 290 which controls the bias current to the power stage 220 is replaced with the control circuit 390 which controls an input power of the power stage 320. Thus, parts of the present embodiment that are the same as those of the embodiment of FIG. 2 will not be described.

Figure 6:
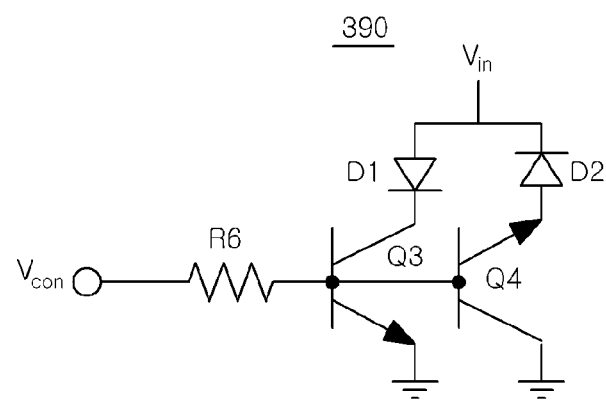
FIG. 6 is a circuit diagram of a control circuit included in the protection circuit of FIG. 5.

FIG. 6 is a circuit diagram of the control circuit included in the protection circuit of FIG. 5. The control circuit 390 may include a sixth resistor R6, a third transistor Q3, a fourth transistor Q4, a first diode D1, and a second diode D2.

A base of the third transistor Q3 and a base of the fourth transistor Q4 are coupled to an output node of the control voltage generation circuit 380 via the sixth resistor R6. A collector of the third transistor Q3 is coupled to an input node of the power stage 320 via the first diode D1. An emitter of the fourth transistor Q4 is coupled to the input node of the power stage 320 via the second diode D2. An emitter of the third transistor Q3 and a collector of the fourth transistor Q4 are grounded. In this case, an anode of the first diode D1 and a cathode of the second diode D2 are directly coupled to the input node of the power stage 320.

Operations of the protection circuit 350 in accordance with the present embodiment will be described with reference to FIGS. 5 and 6 below. Parts of the protection circuit 350 that are as described above with reference to FIGS. 1 to 4 may not be described.

A process of generating a control voltage $V_{con}$ based on an output voltage and an output current of the power stage 320 is the same as the process performed by the control circuit 290 described above. Thus, operations of the control circuit 390 will be described below.

The control voltage $V_{con}$ generated by the control voltage generating circuit 380 is applied to the control circuit 390 via the output node of the control voltage generation circuit 380. When the control voltage $V_{con}$ exceeds a predetermined value, the third transistor Q3 of the control circuit 390 operates to decrease an input power of the power stage 320, thereby protecting the power amplifier 30 from an abnormal state. Meanwhile, when the collector of the third transistor Q3 is directly coupled to the input node of the power stage 320, the third transistor Q3 may operate even during a normal operation and an input signal to the power stage 320 may thus be distorted. Thus, in the present embodiment, the collector of the third transistor Q3 is coupled to the input node of the power stage 320 via the first diode D1 whose anode is directly coupled to the input node of the power stage 320. Therefore, when the control voltage $V_{con}$ exceeds the predetermined value and an input voltage of the power stage 320 exceeds a predetermined positive value, the third transistor Q3 draws a current from the input node of the power stage 320 so as to decrease the input power of the power stage 320. The predetermined positive value may be determined based on a threshold voltage of the first diode D1.

However, a "forward path" by the third transistor Q3 and the first diode D1 alone is not enough to protect the power amplifier 30 since the power amplifier 30 may experience a high negative current swing as well as a high positive current swing of an RF input signal. Thus, as a "reverse path", the control circuit 370 may include the fourth transistor Q4 and the second diode D2 that are coupled in parallel to the third transistor Q3 and the first diode D1. In contrast to the third transistor Q3 and the first diode D1, the emitter of the fourth transistor Q4 is coupled to the input node of the power stage 320 via the second diode D2 whose cathode is directly coupled to the input node of the power stage 320. Therefore, when the control voltage $V_{con}$ exceeds the predetermined value and an input voltage of the power stage 320 is lower than a predetermined negative value, the fourth transistor Q4 supplies a current to the input node of the power stage 320 so as to decrease the input power of the power stage 320. The predetermined negative value may be determined based on a threshold voltage of the second diode D2. Accordingly, the power amplifier 30 may be effectively protected in various circumstances including the high negative current swing as well as the high positive current swing of the RF input signal.

The protection circuit 250 and the protection circuit 350 described above include only basic passive devices, and devices that are relatively small in volume and have a simple structure, such as a diode, a transistor, etc. Thus, the protection circuit 250 and the protection circuit 350 may be implemented more easily than a protection circuit that employs complex devices such as an operational amplifier, etc.

Figure 7:
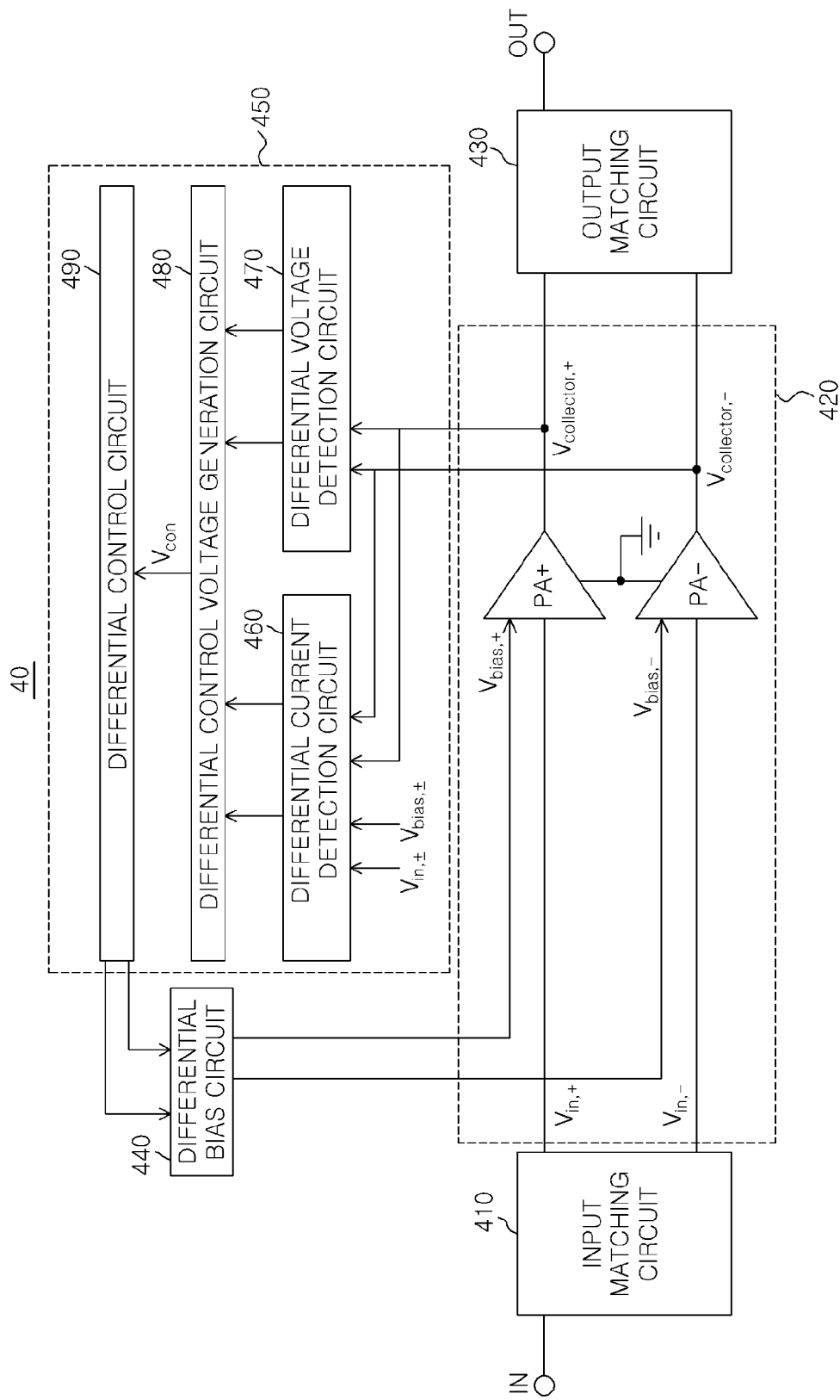
FIG. 7 is a schematic diagram of a differential power amplifier with a bias switching type protection circuit in accordance with an exemplary embodiment.

FIG. 7 is a schematic diagram of a differential power amplifier with a bias switching type protection circuit in accordance with an exemplary embodiment. The differential power amplifier 40 of FIG. 7 may include an input matching circuit 410, a differential power stage 420, an output matching circuit 430, a differential bias circuit 440, and a differential protection circuit 450. The differential power stage 420 in accordance with the present embodiment is implemented according to a differential amplification method, and the input matching circuit 410 and the output matching circuit 430 may also be implemented according to the differential amplification method. The differential protection circuit 450 may include a differential current detection circuit 460, a differential voltage detection circuit 470, a differential control voltage generation circuit 480, and a differential control circuit 490.

Figure 8:
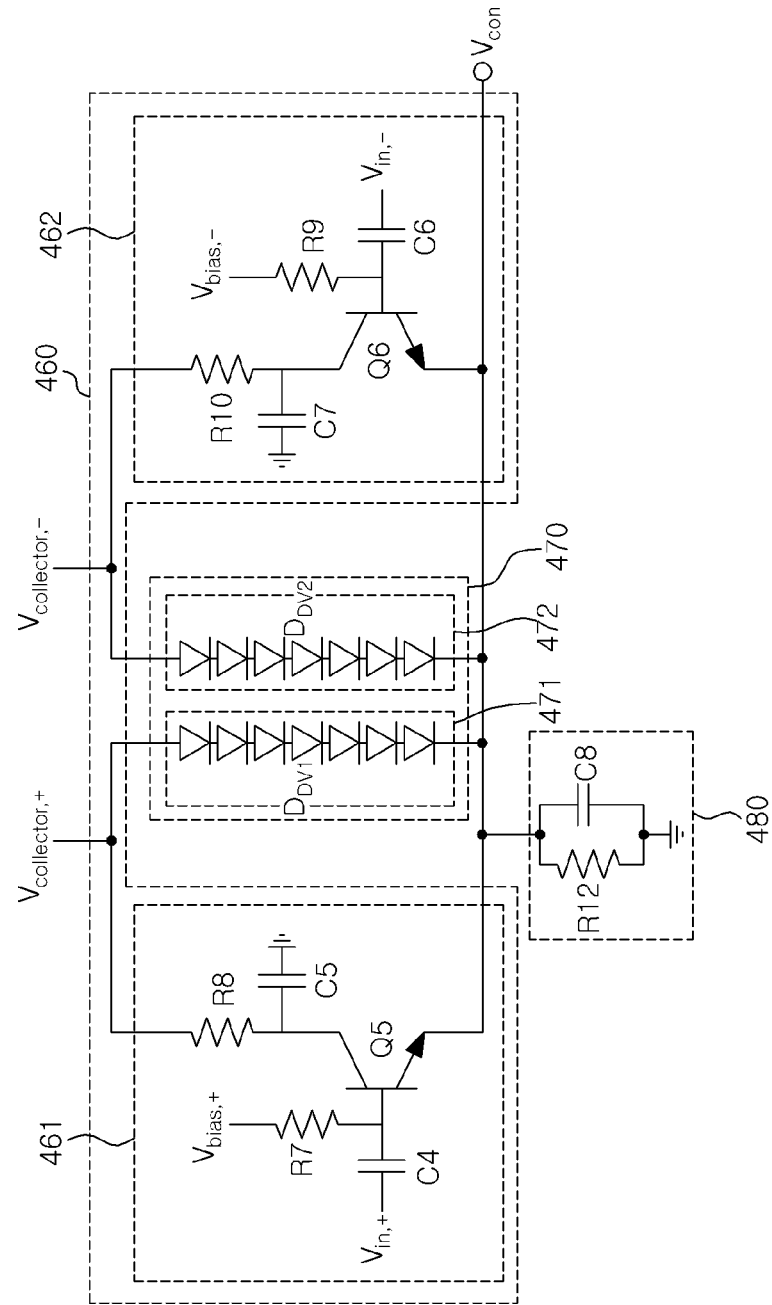
FIG. 8 is a circuit diagram of a differential current detection circuit, a differential voltage detection circuit and a control voltage generation circuit included in the protection circuit of FIG. 7.

FIG. 8 is a circuit diagram of the differential current detection circuit, the differential voltage detection circuit and the differential control voltage generation circuit included in the differential protection circuit of FIG. 7.

The differential current detection circuit 460 may include a first current detection circuit 461 that includes a fifth transistor Q5, a seventh resistor R7, an eighth resistor R8, a fourth capacitor C4, and a fifth capacitor C5, and a second current detection circuit 462 that includes a sixth transistor Q6, a ninth resistor R9, a tenth resistor R10, a sixth capacitor C6, and a seventh capacitor C7.

The structure of the first current detection circuit 461 will be described below. A base of the fifth transistor Q5 is coupled to a positive side of a differential input node of the differential power stage 420 via the fourth capacitor C4, and is coupled to a positive side of a differential bias node of the differential power stage 420 via the seventh resistor R7. A collector of the fifth transistor Q5 is coupled to a positive side of a differential output node of the differential power stage 420 via the eighth resistor R8, and is grounded via the fifth capacitor C5. An emitter of the fifth transistor Q5 is coupled to an output node of the differential control voltage generation circuit 480.

The structure of the second current detection circuit 462 will be described below. A base of the sixth transistor Q6 is coupled to a negative side of the differential input node of the differential power stage 420 via the sixth capacitor C6, and is coupled to a negative side of the differential bias node of the differential power stage 420 via the ninth resistor R9. A collector of the sixth transistor Q6 is coupled to a negative side of the differential output node of the differential power stage 420 via the tenth resistor R10, and is grounded via the seventh capacitor C7. An emitter of the sixth transistor Q6 is coupled to the output node of the differential control voltage generation circuit 480.

The differential voltage detection circuit 470 may include a first voltage detection circuit 471, one end of which is coupled to the positive side of the differential output node of the differential power stage 420 and the other end of which is coupled to the output node of the differential control voltage generation circuit 480, and a second voltage detection circuit 472, one end of which is coupled to the negative side of the differential output node of the differential power stage 420 and the other end of which is coupled to the output node of the differential control voltage generation circuit 480. The first voltage detection circuit 471 may include a first differential diode set $D_{DV1}$ which has one or more diodes connected in series. The second voltage detection circuit 472 may include a second differential diode set $D_{DV2}$ which has one or more diodes connected in series. An anode of the first differential diode set $D_{DV2}$ is coupled to the positive side of the differential output node of the differential power stage 420, and a cathode of the first differential diode set $D_{DV1}$ is coupled to the output node of the differential control voltage generation circuit 480. An anode of the second differential diode set $D_{DV2}$ is coupled to the negative side of the differential output node of the differential power stage 420 and a cathode of the second differential diode set $D_{DV2}$ is coupled to the output node of the differential control voltage generation circuit 480.

One end of the differential control voltage generation circuit 480 is coupled, via the output node thereof, to the differential current detection circuit 460 and the differential voltage detection circuit 470, and another end thereof is grounded. The differential control voltage generation circuit 480 may include a parallel RC circuit in which an eleventh resistor R11 and an eighth capacitor C8 are coupled in parallel to each other. One end of the parallel RC circuit is coupled to the output node of the differential control voltage generation circuit 480, and another end thereof is grounded.

Figure 9:
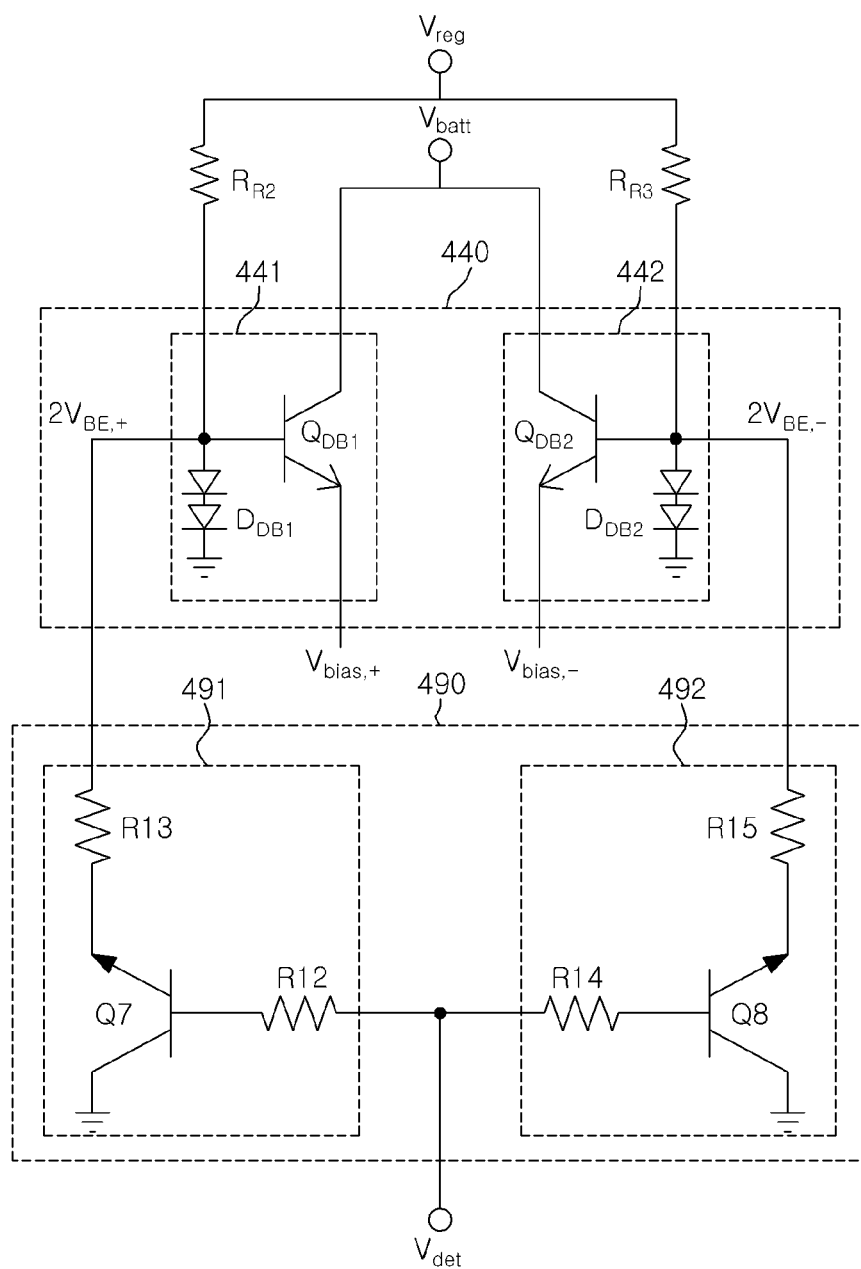
FIG. 9 is a circuit diagram of a differential bias circuit and a differential control circuit included in the protection circuit of FIG. 7.

FIG. 9 is a circuit diagram of the differential bias circuit and the differential control circuit included in the differential protection circuit of FIG. 7.

The differential bias circuit 440 may include a first bias circuit 441 that includes a first differential base diode set $D_{DB1}$ which has one or more diodes connected in series and a first differential bias transistor $Q_{DB1}$, and a second bias circuit 442 that includes a second differential base diode set $D_{DB2}$ which has one or more diodes connected in series and a second differential bias transistor $Q_{DB2}$. Desirably, the first differential base diode set $D_{DB1}$ and the second differential base diode set $D_{DB2}$ may have a structure in which two EBC diodes (base-emitter junction diodes) which are generally used are connected in series.

The structure of the first bias circuit 441 will be described below. An anode of the first differential base diode set $D_{DB1}$ is coupled to a base of the first differential bias transistor $Q_{DB1}$ and a cathode thereof is grounded. An emitter of the first differential bias transistor $Q_{DB1}$ is coupled to the positive side of the differential bias node of the differential power stage 420. A collector of first differential bias transistor $Q_{DB1}$ is coupled to a battery voltage $V_{batt}$ of the differential power amplifier 40. The base of the first differential bias transistor $Q_{DB1}$ is coupled to a regulated voltage $V_{reg}$ via a second regulator resistor $R_{R2}$.

The structure of the second bias circuit 442 will be described below. An anode of the second differential base diode set $D_{DB2}$ is coupled to a base of the second differential bias transistor $Q_{DB2}$ and a cathode thereof is grounded. An emitter of the second differential bias transistor $Q_{DB2}$ is coupled to the negative side of the differential bias node of the differential power stage 420. A collector of the second differential bias transistor $Q_{DB2}$ is coupled to the battery voltage $V_{batt}$ of the differential power amplifier 40. The base of the second differential bias transistor $Q_{DB2}$ is coupled to the regulated voltage $V_{reg}$ via a third regulator resistor $R_{R3}$.

The differential control circuit 490 may include a first control circuit 491 that includes a seventh transistor Q7, a twelfth resistor R12, and a thirteenth resistor R13, and a second control circuit 492 that includes an eighth transistor Q8, a fourteenth resistor R14, and a fifteenth resistor R15.

The structure of the first control circuit 491 will be described below. A base of the seventh transistor Q7 is coupled to the output node of the differential control voltage generation circuit 480 via the twelfth resistor R12, a collector thereof is grounded, and an emitter thereof is coupled to the base of the first differential bias transistor $Q_{DB1}$ via the thirteenth resistor R13.

The structure of the second control circuit 492 will be described below. A base of the eighth transistor Q8 is coupled to the output node of the differential control voltage generation circuit 480 via the fourteenth resistor R14, a collector thereof is grounded, and an emitter thereof is coupled to the base of the second differential bias transistor $Q_{DB2}$ via the fifteenth resistor R15.

Operations of the differential protection circuit 450 in accordance with the present embodiment will be described with reference to FIGS. 7 to 9 below. Parts of the differential protection circuit 450 that are as described above with reference to FIGS. 1 to 6 may not be described.

The differential current detection circuit 460 and the differential voltage detection circuit 470 may detect a differential output voltage and a differential output current of the differential power stage 420, respectively. The differential control voltage generation circuit 480 may generate, via the output node thereof, a control voltage $V_{con}$ that is substantially proportional to the detected differential output voltage and detected differential output current.

In detail, the first current detection circuit 461 may output a current which is substantially proportional to an output current of the positive side of the differential output node of the differential power stage 420, and the second current detection circuit 462 may output a current which is substantially proportional to an output current of the negative side of the differential output node of the differential power stage 420. The current outputted from the first current detection circuit 461 and the current outputted from the second current detection circuit 462 flow into the differential control voltage generation circuit 480 so as to generate the control voltage $V_{con}$ that is proportional to the current which flows into the differential control voltage generation circuit 480. Consequentially, as the differential output current of the differential power stage 420 increases, the control voltage $V_{con}$ increases. The principle of operating the first current detection circuit 461 and the second current detection circuit 462 is substantially the same as that of operating the current detection circuit 260 described above.

The first differential diode set $D_{DV1}$ included in the first voltage detection circuit 471 may be 'on' when an output voltage of the positive side of the differential output node of the differential power stage 420 is greater than a threshold voltage of the first differential diode set $D_{DV1}$. When the first differential diode set $D_{DV1}$ is 'on,' a current flows into the differential control voltage generation circuit 480 via the first differential diode set $D_{DV1}$ to generate a control voltage $V_{con}$ which is substantially proportional to the output voltage of the positive side of the differential output node of the differential power stage 420. Similarly, the second differential diode set $D_{DV2}$ included in the second voltage detection circuit 472 may be 'on' when an output voltage of the negative side of the differential output node of the differential power stage 420 is greater than a threshold voltage of the second differential diode set $D_{DV2}$. When the second differential diode set $D_{DV2}$ is 'on,' a current flows into the differential control voltage generation circuit 480 via the second differential diode set $D_{DV2}$ to generate a control voltage $V_{con}$ which is substantially proportional to the output voltage of the negative side of the differential output node of the differential power stage 420. The current outputted from the first voltage detection circuit 471 and the current outputted from the second voltage detection circuit 462 flow into the differential control voltage generation circuit 480 so as to generate the control voltage $V_{con}$ that is proportional to the current which flows into the differential control voltage generation circuit 480. Consequentially, as a differential output voltage of the differential power stage 420 increases, the control voltage $V_{con}$ increases.

Through the above process, the control voltage $V_{con}$ is generated based on both the differential output voltage and the differential output current of the differential power stage 420.

The control voltage $V_{con}$ is applied to the control circuit 490 via the output node of the differential control voltage generation circuit 480. In the present embodiment, the first control circuit 491 and the second control circuit 492 operate symmetrically due to the differential amplification structure. When the control voltage $V_{con}$ exceeds a predetermined value, the first control circuit 491 draws a current from the first bias circuit 441 coupled to the positive side of the differential bias node of the differential power stage 420, and the second control circuit 492 draws a current from the second bias circuit 442 coupled to the negative side of the differential bias node of the differential power stage 420. Particular operations and effects of the first control circuit 491 and the second control circuit 492 are substantially the same as those of the control circuit 290.

When a general protection circuit is applied to a differential amplification structure, a problem may occur due to an asymmetric loop gain of a differential input signal. In the present embodiment, the differential control circuit 490 may symmetrically control the positive side and the negative side of the differential bias node of the differential power stage 420 and may thus protect the differential power amplifier 40 more stably without causing the above problem.

Figure 10:
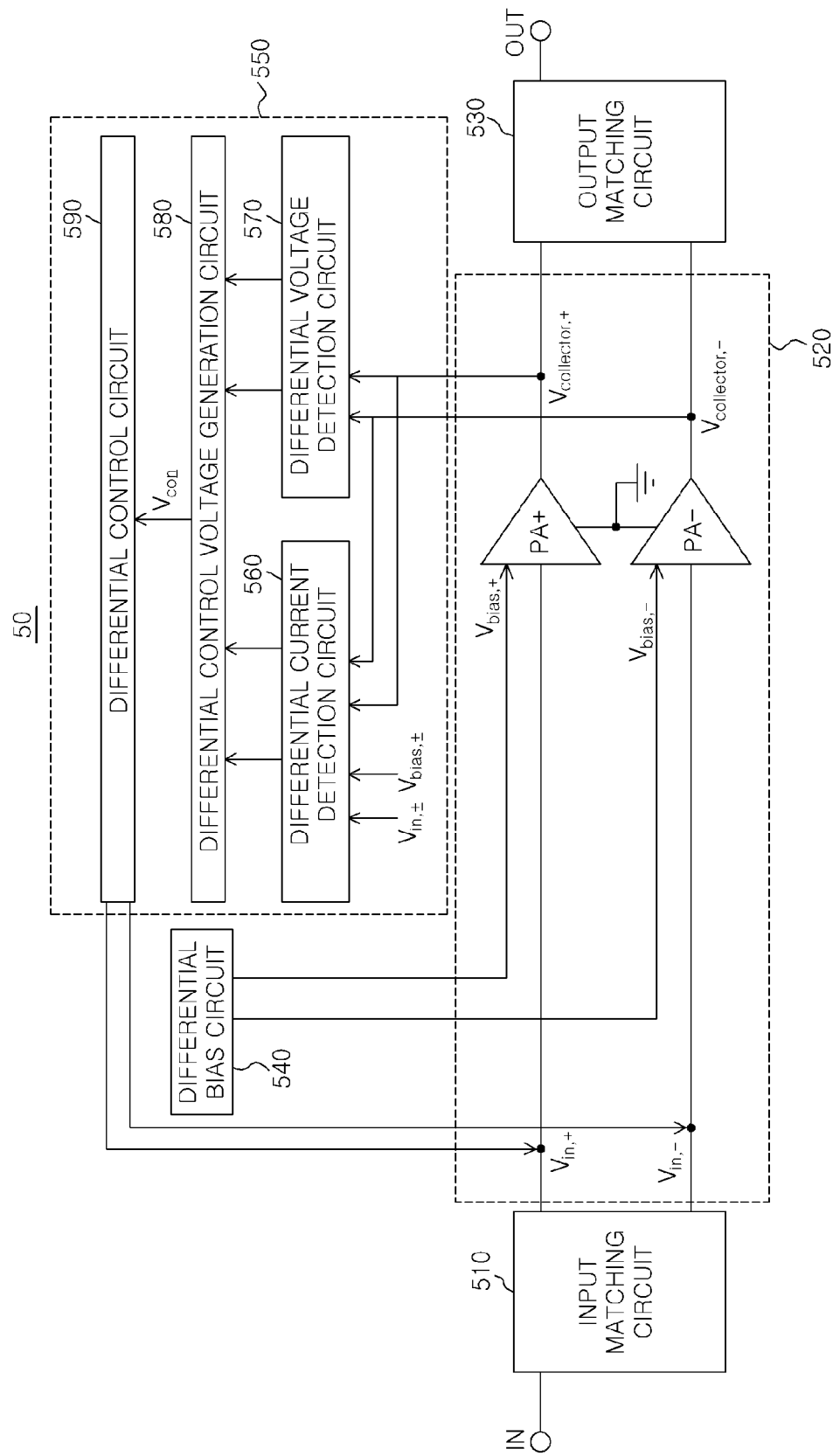
FIG. 10 is a schematic diagram of a differential power amplifier with a gain attenuation type protection circuit in accordance with an exemplary embodiment.

FIG. 10 is a schematic diagram of a differential power amplifier with a gain attenuation type protection circuit in accordance with an exemplary embodiment. The differential power amplifier 50 of FIG. 10 may include an input matching circuit 510, a differential power stage 520, an output matching circuit 530, a differential bias circuit 540, and the differential protection circuit 550. The differential protection circuit 550 may include a differential current detection circuit 560, a differential voltage detection circuit 570, a differential control voltage generation circuit 580, and a differential control circuit 590. The present embodiment is substantially the same as the embodiment of FIG. 7, except that the differential control circuit 490 which controls the differential bias current to the differential power stage 420 is replaced with the differential control circuit 590 which controls a differential input power of the differential power stage 520. Thus, parts of the present embodiment that are the same as those of the embodiment of FIG. 7 will not be described.

Figure 11:
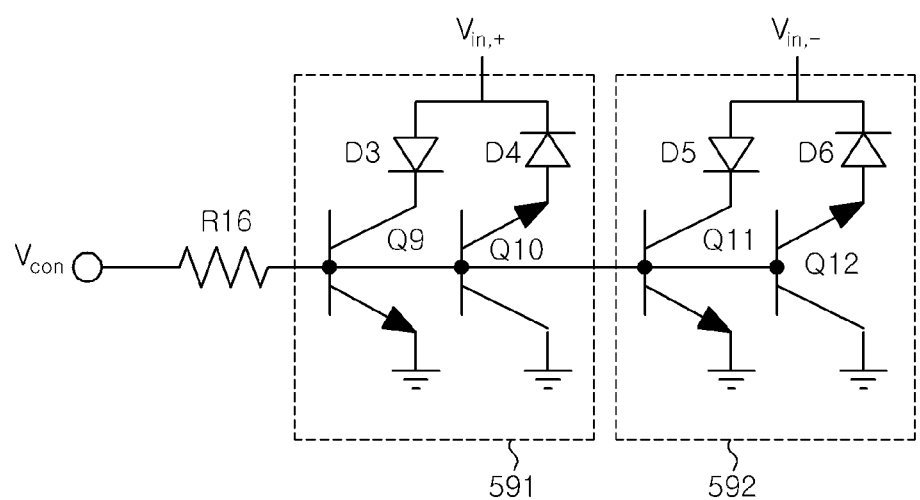
FIG. 11 is a circuit diagram of a differential control circuit included in the protection circuit of FIG. 10.

FIG. 11 is a circuit diagram of the differential control circuit included in the protection circuit of FIG. 10. The differential control circuit 590 may include a sixteenth resistor R16, a first control circuit 591, and a second control circuit 592. The first control circuit 591 may include a ninth transistor Q9, a tenth transistor Q10, a third diode D3, and a fourth diode D4. The second control circuit 592 may include an eleventh transistor Q11, a twelfth transistor Q12, a fifth diode D5, and a sixth diode D6.

The structure of the first control circuit 591 will be described below. A base of the ninth transistor Q9 and a base of the tenth transistor Q10 are coupled to an output node of the differential control voltage generation circuit 580 via the sixteenth resistor R16. A collector of the ninth transistor Q9 is coupled to a positive side of a differential input node of the differential power stage 520 via the third diode D3. An emitter of the tenth transistor Q10 is coupled to the positive side of the differential input node of the differential power stage 520 via the fourth diode D4. An emitter of the ninth transistor Q9 and a collector of the tenth transistor Q10 are grounded. In this case, an anode of the third diode D3 and a cathode of the fourth diode D4 are directly coupled to the positive side of the differential input node of the differential power stage 520.

The structure of the second control circuit 592 will be described below. A base of the eleventh transistor Q11 and a base of the twelfth transistor Q12 are coupled to the output node of the differential control voltage generation circuit 580 via the sixteenth resistor R16. A collector of the eleventh transistor Q11 is coupled to a negative side of the differential input node of the differential power stage 520 via the fifth diode D5. An emitter of the twelfth transistor Q12 is coupled to the negative side of the differential input node of the differential power stage 520 via the sixth diode D6. An emitter of the eleventh transistor Q11 and a collector of the twelfth transistor Q12 are grounded. In this case, an anode of the fifth diode D5 and a cathode of the sixth diode D6 are directly coupled to the negative side of the differential input node of the differential power stage 520.

Operations of the differential protection circuit 550 in accordance with the present embodiment will be described with reference to FIGS. 10 and 11 below. Parts of the present embodiment that are the same as those described above with reference to FIGS. 1 to 9 may not be described.

A control voltage $V_{con}$ generated by the differential control voltage generation circuit 580 is applied to the differential control circuit 590 via the output node of the differential control voltage generation circuit 580. When the control voltage $V_{con}$ exceeds a predetermined value, the first control circuit 591 decreases an input power of the positive side of the differential input node of the differential power stage 520, and the second control circuit 592 decreases an input power of the negative side of the differential input node of the differential power stage 520. Thus, the differential power amplifier 50 may be protected from an abnormal state. Operations and effects of the first control circuit 571 and the second control circuit 572 are substantially the same as those of the control circuit 390. The differential control circuit 590 symmetrically controls the input power of both the positive side and the negative side of the differential input node of the differential power stage 520, similarly to the differential control circuit 470 described above. Thus, the differential protection circuit 550 in accordance with the present embodiment may protect the differential power amplifier 50 more stably without causing a problem due to an asymmetric loop gain.

Figure 12:
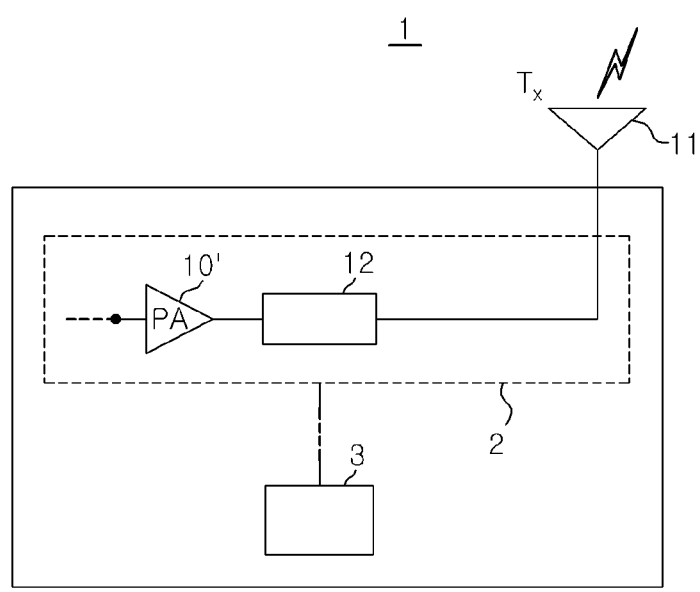
FIG. 12 is a block diagram of a cellular mobile system with a power amplifier in accordance with an exemplary embodiment.

FIG. 12 is a block diagram of a cellular mobile system with a power amplifier in accordance with an exemplary embodiment.

In accordance with the present teachings, the cellular mobile system 1 may be at least a portion of a wireless communications system which is implemented to support standards for wireless communication such as the third generation (3G), 4G LTE, etc.

Referring to FIG. 12, the cellular mobile system 1 may comprise an RF signal transmitter 2. Further, in various embodiments, another component 3 within the purview of one of ordinary skill in the art may be incorporated into the cellular mobile system 1 without departing from the scope of the present teachings. Such component 3 may be a processor, a power source, a display, an interface, a keyboard, an audio/video subsystem, and/or any other component for enabling the cellular mobile system 1 to function as a mobile phone. However, they are not detailed here for the convenience of discussion.

In accordance with the present teachings, the RF signal transmitter 2 may comprise a power amplifier 10' and an antenna 11, and, in various embodiments, the RF signal transmitter 2 may further comprise an additional component 12. Specifically, the power amplifier 10' illustrated in FIG. 12 is configured to amplify an RF signal to be outputted from the antenna 11. The power amplifier 10' may be one of RF power amplifiers and variants thereof which have been discussed above in the present teachings. Further, the antenna 11 is configured to transmit the RF signal wirelessly. Also, the additional component 12 may configured to receive and/or process the RF signal between the power amplifier 10' and the antenna 11. Such component may comprise a transmission line, an impedance matching network, and/or a filter, but the present teachings are not limited thereto.

FIG. 13 is a flow chart of a method for protecting a power amplifier by using a protection circuit in accordance with an exemplary embodiment.

In step 610, an output voltage and an output current of the power stage of the power amplifier may be detected by using a voltage detection circuit and a current detection circuit, respectively. Next, in step 620, a control voltage which is substantially proportional to the detected output voltage and the detected output current may be generated by using a control voltage generation circuit. This may include generating the control voltage proportional to a current flowing in the control voltage generation circuit and outputting the control voltage to an output node of the control voltage generation circuit wherein the current flowing in the control voltage generation circuit is substantially proportional to the detected output current and the detected output voltage. In step 630, an output power of the power stage may be decreased when the control voltage exceeds a predetermined value. This may include decreasing a bias current to a bias node of the power stage when the control voltage exceeds the predetermined value. Alternatively, this may include decreasing an input power to the power stage when the control voltage exceeds the predetermined value.

In view of this disclosure, it is to be noted that the protection circuit can be implemented in a variety of elements and variant structures. Further, the various elements, structures and parameters are included for purposes of illustrative explanation only and not in any limiting sense. In view of this disclosure, those skilled in the art may be able to implement the present teachings in determining their own applications and needed elements and equipment to implement these applications, while remaining within the scope of the appended claims.

What is claimed is:

1. A power amplifier comprising a power stage, comprising:
    a voltage detection circuit configured to detect an output voltage of the power stage;
    a current detection circuit configured to detect an output current of the power stage;
    a control voltage generation circuit configured to generate a control voltage substantially proportional to the detected output voltage and the detected output current, the control voltage being proportional to a current flowing in the control voltage generation circuit, and being provided to an output node of the control voltage generation circuit; and
    a control circuit configured to decrease an output power of the power stage when the control voltage exceeds a predetermined value wherein the current flowing in the control voltage generation circuit is substantially proportional to the detected output current and the detected output voltage.

2. The power amplifier of claim 1, wherein the control circuit decreases the output power of the power stage by decreasing a bias current to a bias node of the power stage when the control voltage exceeds the predetermined value.

3. The power amplifier of claim 1, wherein the control circuit decreases the output power of the power stage by way of decreasing an input power to the power stage when the control voltage exceeds the predetermined value.

4. The power amplifier of claim 1, wherein the control voltage generation circuit comprises a parallel RC (resistor-capacitor) circuit through which the current flows, the parallel RC circuit being electrically coupled to the output node of the control voltage generation circuit.

5. The power amplifier of claim 1, wherein the current detection circuit comprises a first transistor configured to provide the control voltage generation circuit with a current substantially proportional to the detected output current, the first transistor being electrically coupled between the output node of the power stage and the output node of the control voltage generation circuit.

6. The power amplifier of claim 1, wherein the voltage detection circuit comprises a diode set comprising one or more diodes connected in series,
    wherein the diode set is configured to provide the control voltage generation circuit with a current substantially proportional to the detected output voltage when the detected output voltage exceeds a threshold voltage of the diode set, and
    wherein the diode set is electrically coupled between the output node of the power stage and the output node of the control voltage generation circuit.

7. The power amplifier of claim 6, wherein the threshold voltage of the diode set is equal to a product of a turn-on voltage of the respective one or more diodes included in the diode set and a total number of the diodes.

8. The power amplifier of claim 2, wherein the control circuit comprises a second transistor configured to draw a current from a bias circuit of the power stage so as to reduce the bias current when the control voltage exceeds a predetermined value, the bias circuit biasing the power stage by applying the bias current to the bias node of the power stage.

9. The power amplifier of claim 3, wherein the control circuit comprises:
    a third transistor which is electrically coupled to an input node of the power stage via a first diode, the third transistor configured to decrease the input power of the power stage by drawing a current from the input node of the power stage when the control voltage exceeds the predetermined value and an input voltage of the power stage exceeds a predetermined positive value; and
    a fourth transistor which is electrically coupled to the input node of the power stage via a second diode, the fourth transistor configured to decrease the input power of the power stage by supplying a current to the input node of the power stage when the control voltage exceeds the predetermined value and the input voltage of the power stage is lower than a predetermined negative value.

10. The power amplifier of claim 1, wherein the power amplifier is a differential power amplifier.

11. A cellular mobile system, comprising:
    a power amplifier comprising:
        a voltage detection circuit configured to detect an output voltage of a power stage of the power amplifier;
        a current detection circuit configured to detect an output current of the power stage;
        a control voltage generation circuit configured to generate a control voltage substantially proportional to the detected output voltage and the detected output current, the control voltage being proportional to a current flowing in the control voltage generation circuit, and being provided to an output node of the control voltage generation circuit; and
        a control circuit configured to decrease an output power of the power stage when the control voltage exceeds a predetermined value, wherein the current flowing in the control voltage generation circuit is substantially proportional to the detected output current and the detected output voltage.

12. The cellular mobile system of claim 11, wherein the control circuit decreases the output power of the power stage by way of decreasing a bias current to a bias node of the power stage when the control voltage exceeds the predetermined value.

13. The cellular mobile system of claim 11, wherein the control circuit decreases the output power of the power stage by way of decreasing an input power to the power stage when the control voltage exceeds the predetermined value.

14. The cellular mobile system of claim 11, further comprising an impedance matching circuit which comprises an input matching circuit electrically coupled to an input node of the power stage and an output matching circuit electrically coupled to an output node of the power stage.

15. A method for protecting a power amplifier comprising a power stage, comprising:

detecting an output voltage of the power stage by using a voltage detection circuit and an output current of the power stage by using a current detection circuit;

generating a control voltage substantially proportional to the detected output voltage and the detected output current by using a control voltage generation circuit, the generating the control voltage comprising: generating the control voltage proportional to a current flowing in the control voltage generation circuit; and outputting the control voltage to an output node of the control voltage generation circuit wherein the current flowing in the control voltage generation circuit is substantially proportional to the detected output current and the detected output voltage; and decreasing an output power of the power stage when the control voltage exceeds a predetermined value.

16. The method of claim 15, wherein said decreasing the output power comprises decreasing a bias current to a bias node of the power stage when the control voltage exceeds the predetermined value.

17. The method of claim 15, wherein said decreasing the output power comprises decreasing an input power to the power stage when the control voltage exceeds the predetermined value.

* * * * *